United States Patent [19]
Shiomi et al.

[11] Patent Number: 5,252,840
[45] Date of Patent: * Oct. 12, 1993

[54] SEMICONDUCTOR DEVICE HAVING DIFFERENTLY DOPED DIAMOND LAYERS

[75] Inventors: Hiromu Shiomi; Yoshiki Nishibayashi; Naoji Fujimori, all of Hyogo, Japan

[73] Assignee: Sumitomo Electric Industries, Ltd., Osaka, Japan

[*] Notice: The portion of the term of this patent subsequent to Jul. 21, 2009 has been disclaimed.

[21] Appl. No.: 697,438

[22] Filed: May 9, 1991

[30] Foreign Application Priority Data

May 17, 1990 [JP] Japan .................. 2-128563

[51] Int. Cl.$^5$ .................. H01L 29/161; H01L 29/20
[52] U.S. Cl. ........................... 257/77; 257/472
[58] Field of Search .......... 357/15, 22 J, 61, 22 M; 437/100, 175, 176, 192, 194; 257/77, 472

[56] References Cited

U.S. PATENT DOCUMENTS

| | | | |
|---|---|---|---|
| 4,929,986 | 5/1990 | Yoder | 357/22 |
| 5,006,914 | 4/1991 | Beetz, Jr. | 357/15 |
| 5,107,315 | 4/1992 | Kumagai et al. | 357/16 |
| 5,132,749 | 7/1992 | Nishibayashi et al. | 357/15 |

FOREIGN PATENT DOCUMENTS

| | | | |
|---|---|---|---|
| 0-390209 | 10/1990 | European Pat. Off. | |
| 57-121288 | 7/1982 | Japan | |
| 58-141572 | 8/1983 | Japan | |
| 59-208821 | 11/1984 | Japan | |
| 59-213126 | 12/1984 | Japan | |
| 1-68966 | 3/1989 | Japan | 357/22 |

Primary Examiner—Rolf Hille
Assistant Examiner—Minhlcan Tran
Attorney, Agent, or Firm—Cushman, Darby & Cushman

[57] ABSTRACT

A semiconductor device having active parts made from semiconductor diamond. The active parts include a high doped diamond layer for supplying free carriers and a non- or low doped diamond layer for giving the free carriers a conductive region. The free carriers are transferred from the high doped diamond layer to the non- or low doped diamond layer by diffusion or an applied electric field. Since the free carriers move at high speeds in the non- or low doped diamond layer without being scattered by dopant atoms, the semiconductor device is applicable to high frequency devices with stability against a change in temperature.

21 Claims, 3 Drawing Sheets

SEMICONDUCTOR DEVICE HAVING DIFFERENTLY DOPED DIAMOND LAYERS

FIELD OF THE INVENTION

This invention relates to a semiconductor device having an active part made from diamond semiconductor.

BACKGROUND OF THE INVENTION

Most of current semiconductor devices, e.g. transistors, diodes, logic ICs or memory ICs are made from silicon (Si). Besides silicon, compound semiconductors, e.g. gallium arsenide (GaAS) and indium phosphor (InP) have been used for a limited number of applications, e.g. optical devices, ultra high speed ICs. Silicon, gallium arsenide and indium phosphor are excellent semiconductor materials.

However, these semiconductor materials cannot be used at high temperature. Silicon semiconductor devices do not work above 200° C. Gallium arsenide semiconductor devices do not work above 300° C. The incapability of the current semiconductor materials at high temperature is caused by their narrow band gaps. The band gaps of silicon and gallium arsenide are 1.1 eV and 1.5 eV respectively. Because of the narrowness of the band gap, these semiconductors enter into the intrinsic region above the temperatures, in which carrier concentrations increase. Excessively high carrier concentrations drastically lower the resistivity of the devices. Thus, the semiconductor devices which enter into the intrinsic region will be broken down soon.

Furthermore, the integration density of integrated circuits has been increasing year by year. Because of the increasing integration density, heat production per unit volume in devices increases also. The big heat production with insufficient heat diffusion often leads to misoperation of the devices.

To solve these difficulties, the Japanese Patent Laying Open No. 59-213126 and the Japanese Patent Laying Open No. 59-208821 proposed new semiconductor devices made from diamond with high heat resistance and with high heat diffusivity.

Diamond has many inherent advantages. First, diamond is chemically very stable. Second, diamond has a very wide band gap (5.5 eV). The band gap is so wide that the intrinsic region does not exist below 1400° C., in which diamond is thermally stable. Here, the "intrinsic" region is the region of temperature in which the electron concentration is nearly equal to the hole concentration. In general, a semiconductor has three different types of current condition—n-type, p-type and intrinsic. The n-type semiconductor has electrons as majority carriers. The p-type semiconductor has holes as majority carriers. The intrinsic semiconductor has the same concentration of electrons and holes. The product (pn) of the electron concentration (n) and the hole concentration (p) is constant. According to the rising of temperature, the product (pn) increases. The product (pn) is simply written as $$pn = (\text{const}) \times (kT)^3 \exp(-E_g/kT)$$

where T is the absolute temperature, Eg is the band gap of the semiconductor and k is the Boltzmann constant. An n-type or a p-type semiconductor is made by doping an n-type dopant or a p-type dopant. However, in the case of semiconductors with narrow band gap Eg, a small rise in temperature increases the square root of (pn) rapidly. When the intrinsic carrier concentration h ($h = (pn)^{\frac{1}{2}}$) increases over the dopant concentration, the electron concentration becomes equal to the hole concentration regardless of the original n-type or p-type dopants. The difference of the concentration between the majority carrier and the minority carrier disappears. In this state, the semiconductor devices do not work. This state is expressed by "entering into the intrinsic region".

Third, diamond has very high heat diffusivity. The heat diffusivity of diamond is 20 W/cm K, which is ten times as much as that of silicon.

Forth, diamond is superior to silicon in the carrier mobilities. The electron mobility is 2000 cm$^2$/Vsec and the hole mobility is 2100 cm$^2$/Vsec at 300 K. The dielectric constant $\epsilon$ of diamond is 5.5. Diamond is gifted with high breakdown field $E_B = 5 \times 10^5$ V/cm. These properties of diamond heighten the speed of signals transmitting in diamond semiconductors. Higher breakdown field enables us to apply bigger input signals or controlling signals, which leads to the high speed transmission of signals.

Since diamond has the advantages; wide band gap, chemical and physical stability, high heat diffusivity, high carrier mobilities and high breakdown voltage, the semiconductor device having semiconductor diamond would have been a device which excels in the heat resistance and the environment resistance and works well at high temperature.

The diamond as an active part of a semiconductor device must be a single crystal. A single crystal diamond can be epitaxially grown as a film on a single crystal diamond substrate or on a single crystal silicon substrate from the material gas including hydrogen gas and hydrocarbon by the CVD (Chemical Vapor Deposition) methods. During the epitaxial growth of the diamond layers as films by the CVD methods, doping pertinent dopants, e.g. boron (B) or phosphor (P), we can obtain a p-type diamond or an n-type diamond with low resistivity.

However, the electrical property of the doped semiconductor diamond considerably changes according to the temperature of the environment. Unlike silicon, the doping levels of diamond are so deep that only a part of dopants supply an electron or a hole to the conduction band or to the valence band at room temperature. Here, the doping level means either the electron or hole states, or the energy levels of the electron or hole states of the dopants. In the latter case, the doping level of an electron is measured from the bottom of the conduction band and the doping level of a hole is measured from the top of the valence band. A "shallow doping level" means that the difference between the doping level of an electron and the bottom of the conduction band or the difference between the doping level of a hole and the top of the valence band is very small. In the case of silicon, usual dopants B, P, As or Sb make shallow doping level (about 0.01 eV) which is smaller than the thermal energy kT, where k is the Boltzmann constant and T is the absolute temperature. At room temperature the thermal energy is about 0.025 eV. If the dopant level Ed is smaller than kT, the carrier (electron or hole) of the dopant is fully excited to the conduction band or to the valence band. Thus, the carrier concentration is nearly equal to the dopant concentration in the case of silicon, because the dopants form shallow doping levels.

On the contrary, in the case of the dopant which forms a deep doping level (Ed>kT), some of the dopant atoms release their electron or hole and become ions. The released electrons or holes act as free carriers. But other dopant atoms cannot release their electrons or holes. The number of the former active dopant is proportional to exp($-Ed/kT$). Thus, if the doping level is deep (big Ed), the active dopant is very small. The carrier concentration is far smaller than the dopant concentration. Therefore, desirable dopants are such dopants that form shallow doping levels in the semiconductor.

Unfortunately in general, the doping level of semiconductor diamond is considerably deep. Because of the deep doping level, only a part of dopant atoms release their electrons or holes at room temperature. Other dopant atoms are still neutral atoms. To distinguish the two kinds of dopants, the former dopant atoms which are ionized are named active dopant atoms and the latter dopant atoms which are neutral are named passive dopant atoms. When the temperature is rising, the passive dopant atoms release their electrons or holes and convert to the active atoms. Thus the carrier concentration rises, and rapidly the resistivity decreases.

For example, boron-doped diamond shows the properties of a semiconductor even up to 500° C. It has been confirmed that a transistor made from boron-doped diamond acts as a transistor at 500° C. But the resistivity of the boron-doped diamond at 500° C. is about one third of the resistivity at room temperature. Namely, the resistivity changes considerably according to the change of temperature. Therefore, if diamond semiconductor devices are used in the environment where the temperature changes up and down frequently, the electric property of the device is unstable.

Besides the instability for the temperature fluctuations, the diamond semiconductors have another problem that the carrier mobility decreases and the property of the interface of junctions deteriorates, when the doping amount is increased in order to accomplish larger current gain. When the dopant atoms are doped in the lattice of diamond, the dopant atoms induce lattice defects and fluctuations of the potential for electrons and holes. The lattice defects deteriorate the crystalline property of the interface of diamond. The fluctuation of the potential for carriers raises the possibility of scattering of carriers and decreases the carrier mobility.

SUMMARY OF THE INVENTION

One purpose of this invention is to provide a semiconductor device having diamond layers as active parts which work stably regardless of the change of temperature.

Another purpose of this invention is to provide a semiconductor device having diamond layers as active parts which is immune from the deterioration of lattice structure and the decrease of carrier mobility despite doping high amount of dopant.

Other purpose of this invention is to provide a semiconductor device having diamond layers as active parts which can generate signals with high output power even in hot environments.

The other purpose of this invention is to provide a semiconductor device having diamond layers as active parts which can generate or amplify high frequency signals.

To achieve these purposes, this invention provides a semiconductor device having diamond layers as active parts comprising a higher doped diamond layer as a supplier of carriers with impurity concentration between $10^{18}$ cm$^{-3}$ and $10^{22}$ cm$^{-3}$ and a non- or lower doped diamond layer as a conduction region of carriers with impurity concentration less than $10^{17}$ cm$^{-3}$.

The semiconductor device of this invention may be integrally made from semiconductor diamond. However, some portion of active parts may be replaced by other semiconductor materials, e.g. silicon (Si), germanium (Ge), gallium arsenide (GaAs), gallium nitride (GaN), indium phospher (InP), zinc selenide (ZnSe), cubic boron nitride (c-BN), silicon carbide (SiC), etc or the complexes of these semiconductors.

The diamond layers can be synthesized by the CVD methods. The semiconductor devices of this invention include diodes, bipolar transistors, field effect transistors.

In the definition of this invention, the impurity concentration means the number of impurity atoms in a unit volume. The "impurity" atoms include two kinds of impurities. One is the impurity we add in the material by intention. This intentionally added impurity is called a dopant. The operation for adding the impurity is called doping. The material to be doped is called a matrix.

Another is the impurity which has been originally contained in the material. Although the material for semiconductor fabrication is highly purified, e.g. to 6-N (99.9999%) or 9-N (99.9999999%), very little amount of impurity is left in the material. In the above definition, the "impurity concentration" includes both types of impurities.

The significance, the operations and the advantages of this invention will now be explained.

Non-doped diamond is an insulator. But by doping with some pertinent dopants, e.g. boron (B) or phosphor (P), diamond is converted to either a p-type semiconductor or an n-type semiconductor with lower resistivity, because these dopant atoms form doping levels in the forbidden band.

In order to fabricate semiconductor diamond devices with high power amplification or high power oscillation, the diamond active layers must conduct big current with low resistance. To decrease the resistance, the amount of doping must be increased from the viewpoint of the carrier concentration. However, the atomic distance between a carbon atom (C) and a doping atom (X) is different from the atomic distance between a carbon atom (C) and a carbon atom (C) in the lattice structure. This is called the difference of lattice constants or simply lattice misfit. The doping atoms introduce lattice distortion into the diamond lattice structure through the difference of lattice constants. Thus, doping the dopant atoms into diamond drastically disturbs the lattice structure of the diamond. The induced disorder in the lattice deteriorates the rectifying performance, the breakdown voltage of a pn junction, a Schottky junction between semiconductor diamond layers, or between a semiconductor diamond layer and a metal layer. Furthermore, the lattice disorder induced by doping lowers the carrier mobilities, since the dopant atoms disturb the periodicity of the potential for the carriers and scatters the carriers by the disturbed potential.

Although the high doping of dopants increases the number of carriers which contribute to the conduction of current, it damages the inherent excellences of diamond by decreasing the carrier mobilities, the breakdown voltage of the pn or Schottky junctions, and deteriorating the rectifying performance of the junctions.

On the contrary, non-doped diamond or low doped diamond is superior in crystalline structure to high doped diamond.

The non-doped or low doped diamond should be endowed with high carrier mobilities and high breakdown voltage. However, since this diamond has few impurity atoms for supplying carriers, it has few carriers. The diamond is almost an insulator. No practical electronic device can be fabricated only by the non-doped or low doped diamond in spite of the good lattice structure. The high-doped diamond and the non-doped diamond have complementary characteristics.

Thus, this invention has solved these difficulties by adopting a high doped diamond as a supplier of carriers and a non-doped or low doped diamond as a conducting region of carriers and injecting the carriers from the high doped diamond into non- or low doped diamond by diffusion or the electric field applied. In order to supply a sufficient amount of carriers into the non- or low doped diamond, the impurity concentration of the high-doped diamond must be $10^{18}$ cm$^{-3}$ to $10^{22}$ cm$^{-3}$. If the impurity concentration of the high doped diamond was more than $10^{22}$ cm$^{-3}$, the lattice structure of the diamond would deteriorate so disastrous that it unusable as a layer of a semiconductor device, because it would also damage the lattice structure of the non-doped diamond in contact with it.

Furthermore, to obtain a sufficient output current, the high doped diamond is required to have greater than $10^{19}$ cm$^{-3}$ in impurity concentration. Greater than $10^{20}$ cm$^{-3}$ of impurity concentration is most preferable, because the Fermi degeneration would occur at the high impurity concentration, and the carrier concentration of the diamond would not change so much according to the change of temperature. Thus, the resistivity would become stable regardless of the change of temperature.

On the contrary, the impurity concentration of the non- or low doped diamond must be less than $10^{17}$ cm$^{-3}$ in order not to do damage to the lattice structure of the diamond.

The advantages of the invention will be now explained. The semiconductor device of this invention comprises a high doped diamond as a supplier of carriers and a non- or low doped diamond as a conductive layer of carriers. The carriers are transferred from the high doped diamond to the non-doped diamond by diffusion. Since the carrier concentration of the high doped diamond changes little according to the change of temperature, the electric property of the device is stable enough against the change of temperature. Since the non- or low doped diamond is employed as the conduction layer of carriers, the carriers can move with high mobilities there because of the high order of the crystalline structure. Thus, the semiconductor device of this invention excels in thermal stability against changes of temperature, heat resistance, environment resistance, speed of processing signals and the output power of signals.

DETAILED DESCRIPTION OF THE EMBODIMENTS

EMBODIMENT 1

Figure 1A:
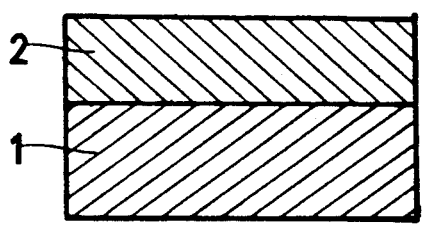
FIG. 1(a) is a sectional view of a p$^+$-type diamond grown on a diamond monocrystalline substrate for showing the first step of producing an embodiment of this invention.

A Schottky diode shown in FIG. 1 is produced by the teaching of this invention. The processes of production are explained by referring to FIGS. 1(a), (b), and (c).

(1) A monocrystalline diamond plate of 2 mm × 1.5 mm × 0.3 mm synthesized by the ultra high pressure method is used as a substrate (1). The crystallographical direction of the surface of the substrate (1) is equal to a (100) plane or is slightly slanting to the (100) plane within five degrees. A p$^+$-type diamond layer (2) doped with boron is epitaxially grown on the monocrystalline diamond substrate (1) up to 10 μm in thickness by the microwave plasma CVD (Chemical Vapor Deposition) method. FIG. 1(a) shows the substrate with the p$^+$-type layer.

The conditions of the microwave plasma CVD are as follows;

| material gas | $H_2$, $CH_4$, $B_2H_5$ |
| --- | --- |
|  | $CH_4/H_2 = 6/100$ |
|  | (ratio in volume) |
|  | $B_2H_5/CH_4 = 0.001/6$ |
|  | (ratio in volume) |
| pressure in the growth | 40 Torr |
| microwave oscillation power | 300 W |
| thickness | 10 μm |

The concentration of boron in the p$^+$-type diamond is $3 \times 10^{20}$ cm$^{-3}$. Here "p$^+$" means "high doped p-type".

(2) A non-doped diamond layer (3) is epitaxially grown up to 0.5 μm in thickness on the p$^+$-type diamond layer (2) by the microwave plasma CVD method under the following conditions;

| material gas | $H_2$, $CH_4$ |
| --- | --- |
|  | $CH_4/H_2 = 6/100$ |
|  | (ratio in volume) |
| pressure in the growth | 40 Torr |
| microwave oscillation power | 300 W |

-continued

| thickness | 0.5 μm |

Figure 1B:
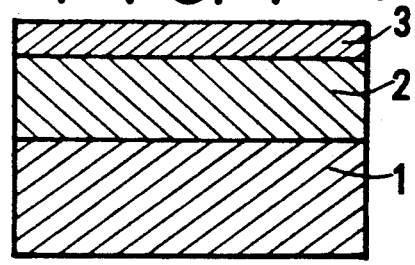
FIG. 1(b) is a sectional view of a non-doped diamond layer deposited on the p$^+$-type diamond for showing the second step of producing the same embodiment.

FIG. 1(b) shows the substrate (1) coated with the p+-type layer (2) and the non-doped layer (3).

(3) A titanium electrode (4) is deposited on a part of the non-doped diamond layer (3) as an ohmic contact electrode by the evaporation coating.

(4) An aluminum electrode (5) is deposited on another part of the non-doped diamond layer (3) as a Schottky electrode by the evaporation coating.

Figure 1C:
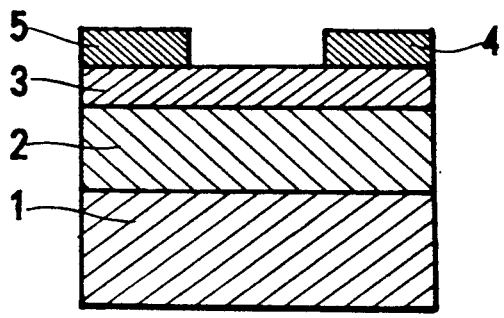
FIG. 1(c) is a sectional view of electrodes coated on the non-doped diamond layer for showing the third step of producing the same embodiment.

FIG. 1(c) shows the Schottky diode. The voltage-current relations are examined at room temperature and at 300° C. The titanium ohmic electrode (4) is connected to the ground level. Forward voltage or reverse voltage is applied on the aluminum Schottky electrode (5). The forward current which flows from the titanium electrode (4) to the aluminum electrode (5) is measured, while the forward voltage is applied between the electrodes (4) and (5). Here, "forward" means the direction from the titanium electrode (4) to the aluminum electrode (5). Then, the negative voltage applied to the aluminum electrode is called the forward voltage.

Figure 2:
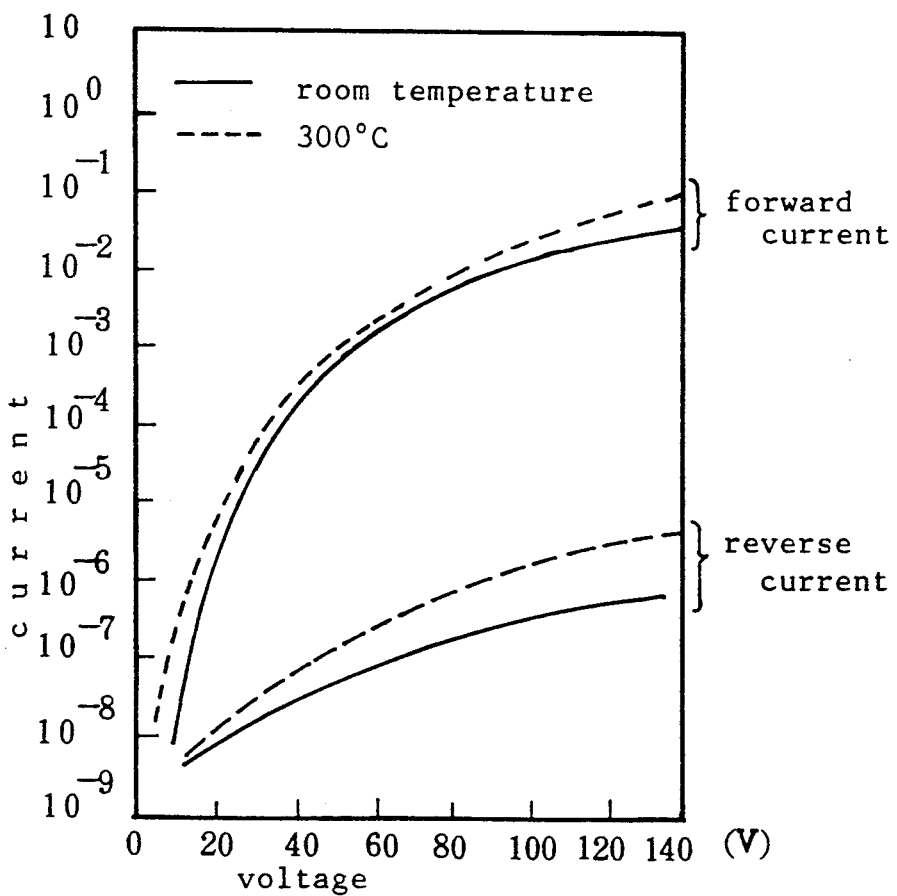
FIG. 2 is a graph of the voltage-current relation of the Schottky diode shown by FIG. 1(c) of the first embodiment of this invention.

FIG. 2 shows the results of the measurements. The abscissa is the voltage (V) applied. The ordinate is the current (A). Although the reverse voltage and the reverse current are negative quantities, the relation therebetween is also depicted together with the forward current-voltage relation in FIG. 2 for simplicity. The upper curves in FIG. 2 show the forward voltage-current relation. Solid line denotes the relation at room temperature. Dotted line denotes the relation at 300° C. These curves show enough large forward currents. The forward currents increase according to rising of temperature. The two curves are not distanced so far in spite of the difference of temperature. This proves the high stability of the device against the change of temperature. This is because the carrier concentration does not change so much by the change of temperature, because the high doped diamond has too many dopants (more than $10^{18}$ cm$^{-3}$) and electronic states are already degenerated in the conduction band or the hole states are degenerated in the valence band.

Besides, the thermal stability, the two curves show high carrier mobilities, because of the large forward currents. This is because the carriers flow in the non- or low doped diamond without being scattered by the heavily-doped dopants in the high doped diamond. Namely, these good features of the device derive from the fact that thec carriers are supplied by the high doped diamond but they flow in the non- or low doped diamond. The dynamics of transference of carriers is now briefly explained. If the carriers supplied by the high doped diamond layer were to stay in the high doped diamond layer, carriers would have been scattered frequently, and the forward current would be very low. In practice, the carriers are transferred from the high doped diamond to the non-doped diamond by diffusion or the electric field applied. Since the high doped diamond has plenty of carriers and the non-doped diamond has little carriers, the carriers will diffuse by the action of the inclination of the carrier concentration. If the interface between the high doped diamond layer and the non-doped diamond layer has been made in good order, the diffusion will occur furiously, because the difference of carrier concentrations is very large. The impurity concentration of the high doped diamond layer is $10^{18}$ cm$^{-3}$ to $10^{22}$ cm$^{-3}$. On the contrary, the impurity concentration of the non- or low doped diamond layer is less than $10^{17}$ cm$^{-3}$. However, the transference of carriers leaves the dopants being ionized. The ionized dopants, positively charged donners or negatively charged acceptors; cause Coulomb attraction for the transferred carriers. This Coulomb attraction pulls the carriers back to the high doped diamond layer. The balance of the diffusion and the Coulomb attraction determines the number of the carriers transferred into the non- or low doped diamond layer.

Another force for transferring the carriers from the high doped layer to the non-doped layer is an electric field applied on the layers. When the electric field is applied in the direction vertical to the interface, the electric field carries the carriers by the electrostatic force into the non-doped diamond layer. Such vertical electric field will be explained later by the embodiment 2.

In the embodiment 1, the carriers borne in the high doped diamond (p+-type) layer (2) are transferred into the non-doped diamond layer (3). Since the non-doped diamond layer (3) has little impurities, the carriers can move freely without being scattered. The voltage applied between the electrodes (4) and (5) makes horizontal electric field in the non-doped layer (3) and in the p+-type (high doped) layer (2). The carriers in the non-doped layer (3) run with high speed because of the high carrier mobility. But the carriers left in the high doped layer (2) run with low speed, being scattered frequently by the dopants. Thus, the electric field does not penetrate into the high doped layer (2). Because the electric field is almost rejected from the high doped layer (2), the carriers there are moved only little. Thus, the energy loss induced by the carriers scattered by the dopants in the high doped layer (2) is trivial in spite of the low mobility of carriers.

In FIG. 2, the lower curves show the reverse voltage-current relation. The reverse currents are small enough. The rectifying ratio; quotient of the forward current to the reverse current at the same voltage; attains to $10^5$. The breakdown voltage does not exist below 140 V. The embodiment 1 exhibits excellent performance as a Schottky diode.

COMPARISON EXAMPLE

Figure 3:
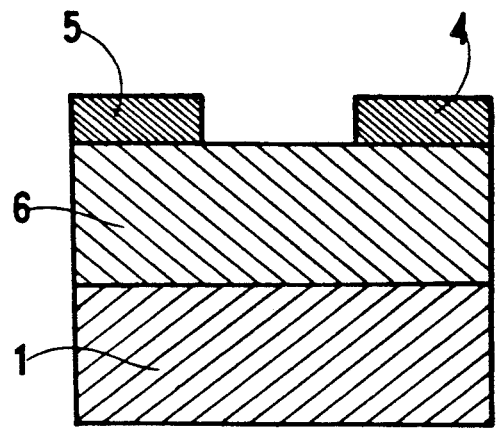
FIG. 3 is a sectional view of a Schottky diode as a comparison example.

To estimate the quality of the embodiments 1 over the prior art, a comparison example as shown in FIG. 3 based on the state of art is manufactured. The comparison example has only a single p-type diamond layer (6) instead of the p-doped layer (2) and the non-doped layer (3) in the embodiment 1. The p-type diamond layer of the comparison example is 10.5 μm in thickness. The boron concentration is $17^{17}$ cm$^{-3}$. A titanium electrode (4) and an aluminum electrode (5) are formed on the p-type diamond layer (6). Like the embodiment 1 shown by FIG. 1(c), the titanium electrode (4) is an ohmic contact electrode and the aluminum electrode (5) is a Schottky contact electrode. In the comparison example, the holes supplied by the dopant atoms in the p-type layer (6) run through the same p-type layer (6), being scattered by the dopant atoms.

Figure 4:
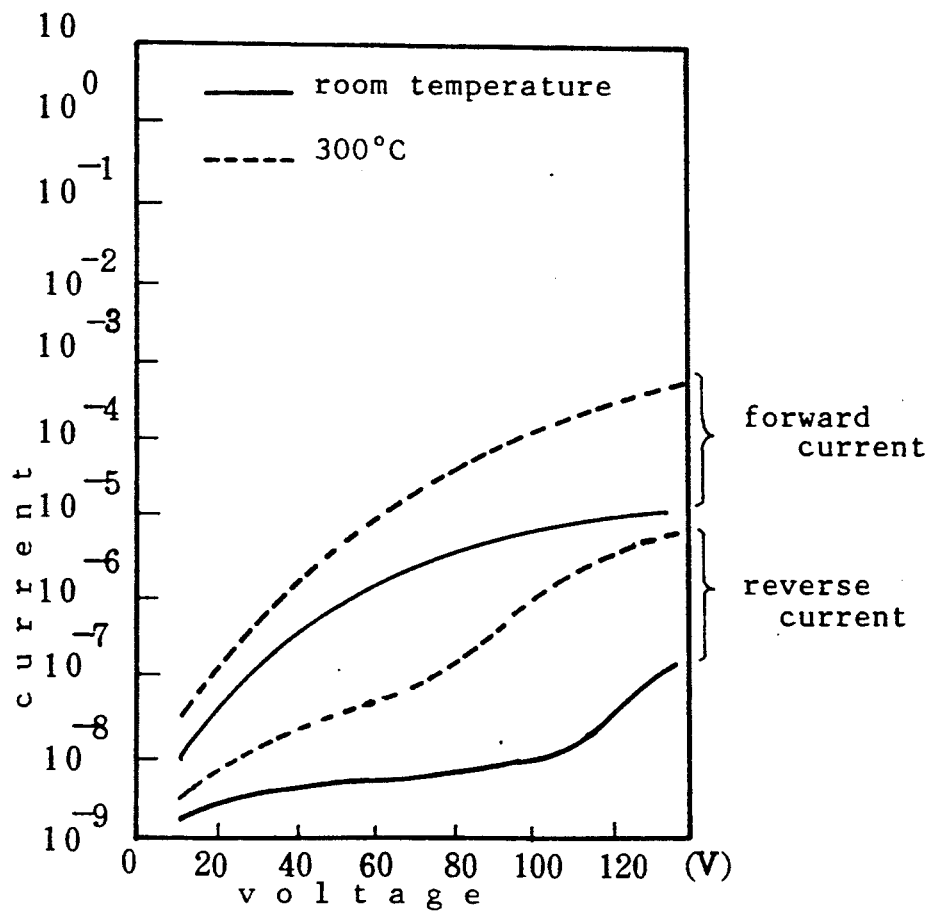
FIG. 4 is a graph of the voltage-current relation of the Schottky diode of the comparison example.

FIG. 4 shown the relation of the voltage-current of the comparison example. The solid lines show the result of the measurement at room temperature. The dotted lines show the result at 300° C. At room temperature, both the forward current and the reverse current are small. At room temperature, the concentration of free holes is too small, because the dopant level is so deep that most of the carriers do not separate from the acceptors. Small number of free holes leads to the low forward current.

But the forward current at 300° C. is about hundred times as much as the forward current at room temperature. At 300° C., most acceptors separate the free holes and are ionized. The concentration of free holes becomes very big. Namely, the forward current changes extremely as a function of temperature. Besides the thermal instability, the comparison example has a drawback that the breakdown voltage is as low as 80 V to 90 V. The thermal instability is caused from the low concentration of dopants ($10^{17}$ cm$^{-3}$). The hole states are not degenerated at room temperature in the valence band, because of the low concentration of dopants and the deep dopant level. On the contrary, the highly-doped ($3 \times 10^{20}$ cm$^{-3}$) diamond layer (2) of the embodiment 1 has, even at room temperature, almost degenerated hole states in the valence band.

If the concentration of dopant in the p-type layer (6) was raised, the problem of the drastic change of carrier concentration as a function of temperature would be solved but the free holes would not run so fast by the scattering owing to the disorder of lattice that the forward current would be very small. Thus, the concentration of dopant should not be raised so much higher than $10^{17}$ cm$^{-3}$ in the p-type layer (6) of the comparison example.

The low breakdown voltage 80 V to 90 V is perhaps caused partly by the disorder of lattice owing to the doping and partly by the thin depletion layer at the Schottky junction. Since the thickness of the depletion layer is inversely proportional to the root square of the dopant concentration, the depletion layer in the p-type layer (6) of the comparison example is much thinner than the depletion layer in the non-doped layer (3) of the embodiment 1. The results of FIG. 2 and FIG. 4 confirm the excellency of the embodiment 1 in the thermal stability and the high breakdown voltage.

EMBODIMENT 2

Embodiment 2 is a Schottky diode having a low doped diamond layer instead of the non-doped diamond layer (3) of the embodiment 1. The low doped layer is a p-type layer doped with boron of $10^{16}$ cm$^{-3}$ in concentration. Other structures are all the same as the embodiment 1 except for the replacement of the non-doped diamond layer (3) by the low doped diamond layer. Thus, the Schottky diode of the embodiment 2 comprises a monocrystalline diamond substrate (2 mm $\times$ 1.5 mm $\times$ 0.3 mm), a p$^+$-type diamond layer (boron concentration = $3 \times 10^{20}$ cm$^{-3}$) of 10 $\mu$m in thickness, a p-type diamond layer (boron concentration = $10^{16}$ cm$^{-3}$) of 0.5 $\mu$m in thickness, a titanium ohmic electrode and an aluminum Schottky electrode.

The forward currents and reverse currents are measured by applying the forward voltage or reverse voltage. The rectifying ratio is about $10^4$. The forward current at 300° C. is nearly twice as much as the forward current at room temperature. The change of the forward current owing to the change of temperature is much less than the change of the comparison example shown by FIG. 4.

EMBODIMENT 3

Figure 5:
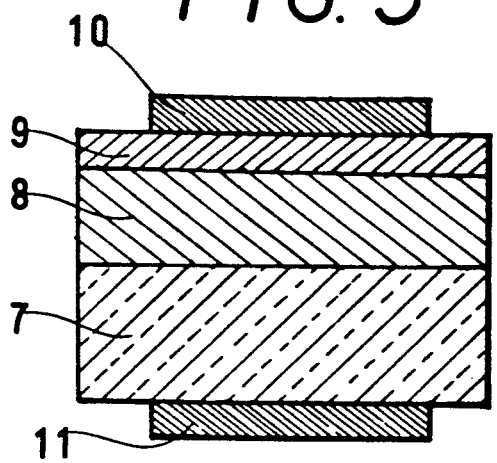
FIG. 5 is a sectioned view of a semiconductor device as the third embodiment.

Another Schottky diode shown in FIG. 5 is fabricated by the teaching of this invention. The Schottky diode comprises a p-type Si substrate (7), a p$^+$-type diamond layer (8), a non-doped diamond layer (9), a tungsten (W) electrode (10) and a gold (Au) electrode (11).

(1) The substrate (7) is a p-type Si plate of 5 mm $\times$ 5 mm $\times$ 0.3 mm instead of diamond. The resistivity is $10^{-2}$ $\Omega$ cm. The p$^+$-type diamond layer (8) is synthesized up to 10 $\mu$m in thickness on the Si substrate by the microwave plasma CVD method under the following conditions;

| material gas | $H_2$, $CH_4$, $B_2H_5$ |
| --- | --- |
| | $CH_4/H_2$ = 1/100 |
| | (ratio in volume) |
| | $B_2H_5/CH_4$ = 0.001/6 |
| | (ratio in volume) |
| pressure | 40 Torr |
| microwave oscillation power | 300 W |
| thickness | 10 $\mu$m |

(2) The non-doped diamond layer (9) is synthesized up to 1 $\mu$m in thickness on the p$^+$-type diamond (8) by the microwave plasma CVD method under the conditions,

| material gas | $H_2$, $CH_4$ |
| --- | --- |
| | $CH_4/H_2$ = 1/100 |
| | (ratio in volume) |
| pressure | 40 Torr |
| microwave oscillation power | 300 W |
| thickness | 1 $\mu$m |

(3) The tungsten electrode (10) is fabricated on the non-doped diamond layer (9) by the sputtering method.

(4) The gold (Au) electrode (11) is coated on the bottom surface of the Si substrate by the evaporation coating using a resistor heater. A current flows in the direction vertical to the interfaces of the layers. Since the sectional area is wide and the length of the current is short in the vertical direction, the series resistance is small. The diode can rectify at most 100 A of alternate current (at 100 V of applied voltage) at room temperature. The test of the diode practiced at 400° C. shows the same forward voltage-current relation as that done at room temperature.

In the embodiment 3, the free holes are injected from the p$^+$-type diamond layer (8) into the non-doped diamond (9) in the vertical direction by the action of the electric field. Although the holes are frequently scattered in the p$^+$-type layer (8), the resistance of the p$^+$-type layer (8) is low enough because of the wide sectional area and the short length of the passage in the layer (8).

EMBODIMENT 4

Figure 6:
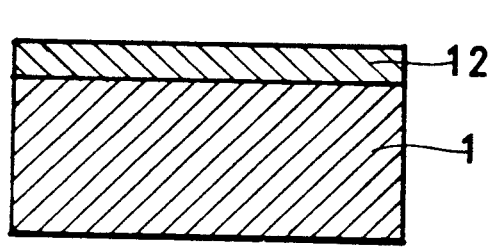
FIG. 6(a) is a sectional view of p$^+$-type diamond grown on a diamond monocrystalline substrate for showing the first step of producing the third embodiment of the invention.
FIG. 6(b) is a sectional view of a non-doped diamond layer deposited on the p$^+$-type diamond for showing the second step of producing the third embodiment.
FIG. 6(c) is a sectional view of electrodes deposited on the non-doped diamond layer for showing the third step of producing the third embodiment.
Figure 6:
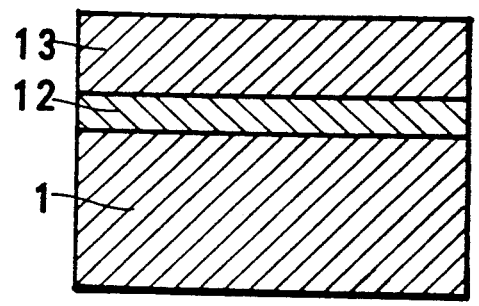
Figure 6:
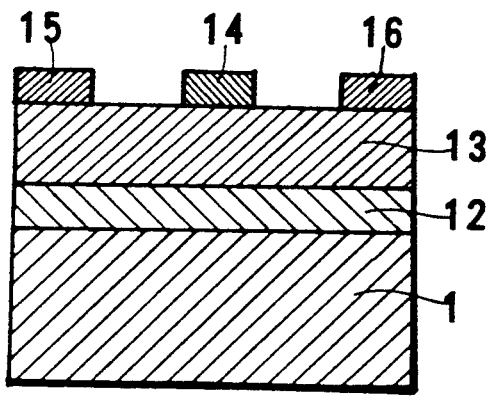

A FET (Field Effect Transistor) shown in FIG. 6 is fabricated by the teaching of this invention.

(1) A monocrystalline diamond substrate (1) of 2 mm $\times$ 1.5 mm $\times$ 0.3 mm synthesized by the ultra high pressure method is used as a substrate. The surface of the substrate is equal to or inclined within 5 degrees to the crystallographic (1 0 0) plane. A p$^+$-type diamond layer (12) is synthesized up to 0.1 $\mu$m on the substrate (1) by the microwave plasma CVD method under the conditions;

| material gas | $H_2$, $CH_4$, $B_2H_5$ |
| --- | --- |
| | $CH_4/H_2 = 6/100$ |
| | (ratio in volume) |
| | $B_2H_5/CH_4 = 0.001/6$ |
| | (ratio in volume) |
| pressure | 40 Torr |
| microwave oscillation power | 300 W |
| thickness | 0.1 μm |

The boron concentration in the $p^+$-type diamond layer (12) is $3 \times 10^{20}$ cm$^{-3}$. FIG. 6(a) shows the substrate (1) deposited with the $p^+$-type diamond layer (12).

(2) A non-doped diamond layer (13) is grown up to 0.5 μm on the $p^+$-type diamond layer (12), as shown in FIG. 6(b), by the microwave CVD method under the same conditions as the step (1) except for the nonuse of the dopant gas $B_2H_6$, namely;

| material gas | $H_2$, $CH_4$ |
| --- | --- |
| | $CH_4/H_2 = 6/100$ |
| | (ratio in volume) |
| pressure | 40 Torr |
| microwave oscillation power | 300 W |
| thickness | 0.5 μm |

(3) An aluminum gate electrode (14) is deposited on the non-doped diamond layer (13) by the aid of the photolithography. The gate electrode (14) is a Schottky contact electrode with the length of 1 μm and the width of 10 μm.

(4) A titanium source electrode (15) and a titanium drain electrode (16) are deposited on the non-doped diamond layer (13) by the aid of the photolithography. The titanium electrodes (15) and (16) are, of course, ohmic contact electrodes with the width of 10 μm. FIG. 6(c) shows the FET (Field Effect Transistor) of the embodiment 4. The $p^+$-type layer (13) supplies holes into the non-doped layer (13). The holes mainly move in the non-doped layer (13) without being scattered by dopant atoms. The FET of the embodiment 4 is able to amplify 12 GHz of microwave without deforming the shape of waves.

What is claimed is:

1. A semiconductor device comprising:
a monocrystalline diamond substrate,
a $p^+$-type diamond layer with $10^{18}$ cm$^{-3}$ to $10^{22}$ cm$^{-3}$ of dopant atoms deposited on the substrate,
a non-doped diamond layer deposited on the $p^+$-type diamond layer,
an ohmic contact electrode deposited on the non-doped diamond layer, and
Schottky contact electrode deposited on the non-doped diamond layer.

2. A semiconductor device comprising:
a monocrystalline diamond substrate,
a boron-doped diamond layer with $10^{18}$ cm$^{-3}$ to $10^{22}$ cm$^{-3}$ of boron atoms deposited on the substrate,
a non-doped diamond layer deposited on the boron-doped diamond layer,
an ohmic contact titanium electrode deposited on the non-doped diamond layer, and
a Schottky contact aluminum electode deposited on the non-doped diamond layer.

3. A semiconductor device comprising:
a monocrystalline diamond substrate,
a $p^+$-type diamond layer with $10^{18}$ cm$^{-3}$ to $10^{22}$ cm$^{-3}$ of dopant atoms deposited on the substrate,
a low doped diamond layer with less than $10^{17}$ cm$^{-3}$ of impurity atoms deposited on the $p^+$-type diamond layer,
an ohmic contact electrode deposited on the low doped diamond layer, and
a Schottky contact electrode deposited on the low doped diamond layer.

4. A semiconductor device comprising:
a monocrystalline diamond substrate,
a high boron-doped diamond layer with $10^{18}$ cm$^{-3}$ to $10^{22}$ cm$^{-3}$ of boron atoms deposited on the substrate,
a low boron-doped diamond with less than $10^{17}$ cm$^{-3}$ of impurity atoms deposited on the high boron-doped diamond layer,
an ohmic contact titanium electrode deposited on the low boron-doped diamond layer, and
a Schottky contact aluminum electrode deposited on the low boron-doped diamond layer.

5. A semiconductor device comprising:
a monocrystalline silicon substrate having a first and second side,
a high doped diamond layer with $10^{18}$ cm$^{-3}$ to $10^{22}$ cm$^{-3}$ of dopant atoms deposited on the first side of the silicon substrate,
a low-doped diamond layer with less than $10^{17}$ cm$^{-3}$ of impurity atoms deposited on the high doped diamond layer;
a Schottky contact electrode deposited on the low-doped diamond layer, and
an ohmic contact electrode deposited on the second side of the silicon substrate.

6. A semiconductor device comprising:
a monocrystalline diamond substrate,
a high doped diamond layer with $10^{18}$ cm$^{-3}$ to $10^{22}$ cm$^{-3}$ of dopant atoms deposited on the substrate,
a low doped diamond layer with less than $10^{17}$ cm$^{-3}$ of impurity atoms deposited on the high doped diamond layer,
an ohmic contact source electrode deposited on the low doped diamond layer,
a Schottky contact gate electrode deposited on the low doped diamond layer, and
an ohmic contact drain electrode deposited on the low doped diamond layer.

7. A simiconductor device comprising:
a substrate selected from the group consisting of Si, Ge, GaAs, GaN, InP, ZnSe, c-BN or SiC,
a high doped diamond layer with $10^{18}$ cm$^{-3}$ to $10^{22}$ cm$^{-3}$ of dopant atoms deposited on the substrate,
a low doped diamond layer with less than $10^{17}$ cm$^{-3}$ of impurity atoms deposited on the high doped diamond layer,
an ohmic contact source electrode deposited on the low doped diamond layer,
a Schottky contact gate electrode deposited on the low doped diamond layer, and
an ohmic contact drain electrode deposited on the low doped diamond layer.

8. A semiconductor device comprising:
a substrate;
a high doped diamond layer for supplying free carriers deposited on said substrate;
a non-doped diamond layer for giving said free carriers a conductive region deposited on said high doped diamond layer, a portion of said free carriers being transferred from said high doped diamond layer to said non-doped diamond layer.

9. The semiconductor device as in claim 8, further comprising:
electrodes deposited on said non-doped diamond layer.

10. The semiconductor device as in claim 8, wherein an impurity concentration of said high doped diamond layer is between $10^{18}$ cm$^{-3}$ and $10^{22}$ cm$^{-3}$.

11. The semiconductor device as in claim 8, wherein said portion of free electrons transferred from said high doped diamond layer to said non-doped diamond layer are transferred by diffusion.

12. The semiconductor device as in claim 8, wherein said portion of free electrons transferred from said high doped diamond layer to said non-doped diamond layer are transferred by an applied electric field.

13. A semiconductor device comprising:
a substrate;
a high doped diamond layer for supplying free carriers deposited on said substrate;
a low doped diamond layer for giving said free carriers a conductive region deposited on said high doped diamond layer, a portion of said free carriers being transferred from said high doped diamond layer to said low doped diamond layer.

14. The semiconductor device as in claim 13, further comprising:
electrodes deposited on said non-doped diamond layer.

15. The semiconductor device as in claim 13, wherein an impurity concentration of said high doped diamond layer is between $10^{18}$ cm$^{-3}$ and $10^{22}$ cm$^{-3}$.

16. The semiconductor device as in claim 13, wherein an impurity concentration of said low doped diamond layer is less than $10^{17}$ cm$^{-3}$.

17. The semiconductor device as in claim 13, wherein said portion of free electrons transferred from said high doped diamond layer to said low doped diamond layer are transferred by diffusion.

18. The semiconductor device as in claim 13, wherein said portion of free electrons transferred from said high doped diamond layer to said low doped diamond layer are transferred by an applied electric field.

19. A semiconductor device comprising:
a monocrystalline silicon substrate having a first and second side,
a high doped diamond layer with $10^{18}$ cm$^{-3}$ to $10^{22}$ cm$^{-3}$ of dopant atoms deposited on the first side of the silicon substrate,
a non-doped diamond layer deposited on the high doped diamond layer;
a Schottky contact electrode deposited on the non-doped diamond layer, and
an ohmic contact electrode deposited on the second side of the silicon substrate.

20. A semiconductor device comprising:
a monocrystalline diamond substrate,
a high doped diamond layer with $10^{18}$ cm$^{-3}$ to $10^{22}$ cm$^{-3}$ of dopant atoms deposited on the substrate,
a non-doped diamond layer deposited on the high doped diamond layer,
an ohmic contact source electrode deposited on the non-doped diamond layer,
a Schottky contact gate electrode deposited on the non-doped diamond layer, and
an ohmic contact drain electrode deposited on the non-doped diamond layer.

21. A semiconductor device comprising:
a substrate selected from the group consisting of Si, Ge, GaAs, GaN, InP, ZnSe, c-BN or SiC,
a high doped diamond layer with $10^{18}$ cm$^{-3}$ to $10^{22}$ cm$^{-3}$ of dopant atoms deposited on the substrate,
a non-doped diamond layer deposited on the high doped diamond layer,
an ohmic contact source electrode deposited on the non-doped diamond layer,
a Schottky contact gate electrode deposited on the non-doped diamond layer, and
an ohmic contact drain electrode deposited on the non-doped diamond layer.

* * * * *